(12) United States Patent
Butzmann

(10) Patent No.: US 9,840,157 B2
(45) Date of Patent: Dec. 12, 2017

(54) BATTERY MANAGEMENT SYSTEM AND BATTERY SYSTEM

(71) Applicants: Robert Bosch GmbH, Stuttgart (DE); Samsung SDI Co., Ltd., Yongin-si, Gyeonggi-do (KR)

(72) Inventor: Stefan Butzmann, Schalksmühle (DE)

(73) Assignees: Robert Bosch GmbH, Stuttgart (DE); Samsung SDI Co., Ltd, Yongin-si, Gyeonggi-do (KR)

( * ) Notice: Subject to any disclaimer, the term of this patent is extended or adjusted under 35 U.S.C. 154(b) by 203 days.

(21) Appl. No.: 14/649,302

(22) PCT Filed: Nov. 20, 2013

(86) PCT No.: PCT/EP2013/074256
§ 371 (c)(1),
(2) Date: Jun. 3, 2015

(87) PCT Pub. No.: WO2014/090531
PCT Pub. Date: Jun. 19, 2014

(65) Prior Publication Data
US 2015/0325886 A1    Nov. 12, 2015

(30) Foreign Application Priority Data
Dec. 11, 2012   (DE) .................. 10 2012 222 721

(51) Int. Cl.
*H02J 7/00*   (2006.01)
*B60L 11/18*   (2006.01)
(Continued)

(52) U.S. Cl.
CPC ........... *B60L 11/1851* (2013.01); *H01M 2/34* (2013.01); *H01M 10/425* (2013.01);
(Continued)

(58) Field of Classification Search
USPC ........................................ 320/116
See application file for complete search history.

(56) References Cited

U.S. PATENT DOCUMENTS 5,666,040 A * 9/1997 Bourbeau ............. H01M 2/348
320/118
5,965,996 A * 10/1999 Arledge ................ H02J 7/0016
320/116
(Continued)

FOREIGN PATENT DOCUMENTS

CN         101689764 A      3/2010
DE    10 2009 020 178 A1   11/2010
(Continued)

OTHER PUBLICATIONS

International Search Report corresponding to PCT Application No. PCT/EP2013/074256, dated Jan. 2, 2014 (German and English language document) (5 pages).

*Primary Examiner* — Samuel Berhanu
(74) *Attorney, Agent, or Firm* — Maginot, Moore & Beck LLP

(57) ABSTRACT

A control circuit is configured to monitor and control the operation of a rechargeable battery. The rechargeable battery includes a plurality of interconnected battery cells which are connected to at least one pole connection of the battery by at least one circuit element such that the at least one pole can be electrically decoupled from the rechargeable battery. The control circuit further includes at least one cell monitoring device configured to detect operational parameters of at least one battery cell, and a first control device configured to determine battery properties by evaluating operational parameters. The first control device is connected to the at least one cell monitoring device by a first interface. The control circuit further includes a second control device configured to control the at least one circuit element and
(Continued)

which is connected to the at least one cell monitoring device by a second interface.

10 Claims, 1 Drawing Sheet

(51) Int. Cl.
*H01M 2/34* (2006.01)
*H01M 10/42* (2006.01)
*H01M 10/48* (2006.01)
*H04Q 9/00* (2006.01)
*G01R 31/36* (2006.01)
*G01R 19/165* (2006.01)

(52) U.S. Cl.
CPC ......... *H01M 10/482* (2013.01); *H02J 7/0031* (2013.01); *H04Q 9/00* (2013.01); *G01R 19/16542* (2013.01); *G01R 31/362* (2013.01); *G01R 31/3658* (2013.01); *G01R 31/3679* (2013.01); *H01M 2010/4271* (2013.01); *H01M 2200/00* (2013.01); *H04Q 2209/10* (2013.01); *H04Q 2209/30* (2013.01); *Y02T 10/705* (2013.01); *Y02T 10/7011* (2013.01)

(56) References Cited

U.S. PATENT DOCUMENTS

| | | | | | |
|---|---|---|---|---|---|
| 5,998,969 | A | * | 12/1999 | Tsuji | H02J 7/0016 320/130 |
| 6,043,628 | A | * | 3/2000 | Perelle | B60L 11/185 320/119 |
| 6,069,468 | A | * | 5/2000 | Sonobe | H01M 10/4257 320/106 |
| 6,184,660 | B1 | * | 2/2001 | Hatular | H02J 7/022 320/139 |
| 6,810,338 | B2 | * | 10/2004 | Mercke | G01R 19/16542 320/137 |
| 9,007,065 | B2 | * | 4/2015 | Shimizu | G01R 31/36 320/116 |
| 2007/0105010 | A1 | | 5/2007 | Cassidy | |
| 2011/0181246 | A1 | * | 7/2011 | Tae | H02J 7/0014 320/118 |
| 2011/0316520 | A1 | * | 12/2011 | Kawahara | B60L 3/0046 323/351 |
| 2013/0181681 | A1 | * | 7/2013 | Mukai | H02J 7/0031 320/134 |

FOREIGN PATENT DOCUMENTS

| | | |
|---|---|---|
| DE | 10 2011 004 980 A1 | 9/2012 |
| DE | 10 2011 079 120 A1 | 1/2013 |
| EP | 2 166 642 A1 | 3/2010 |

* cited by examiner

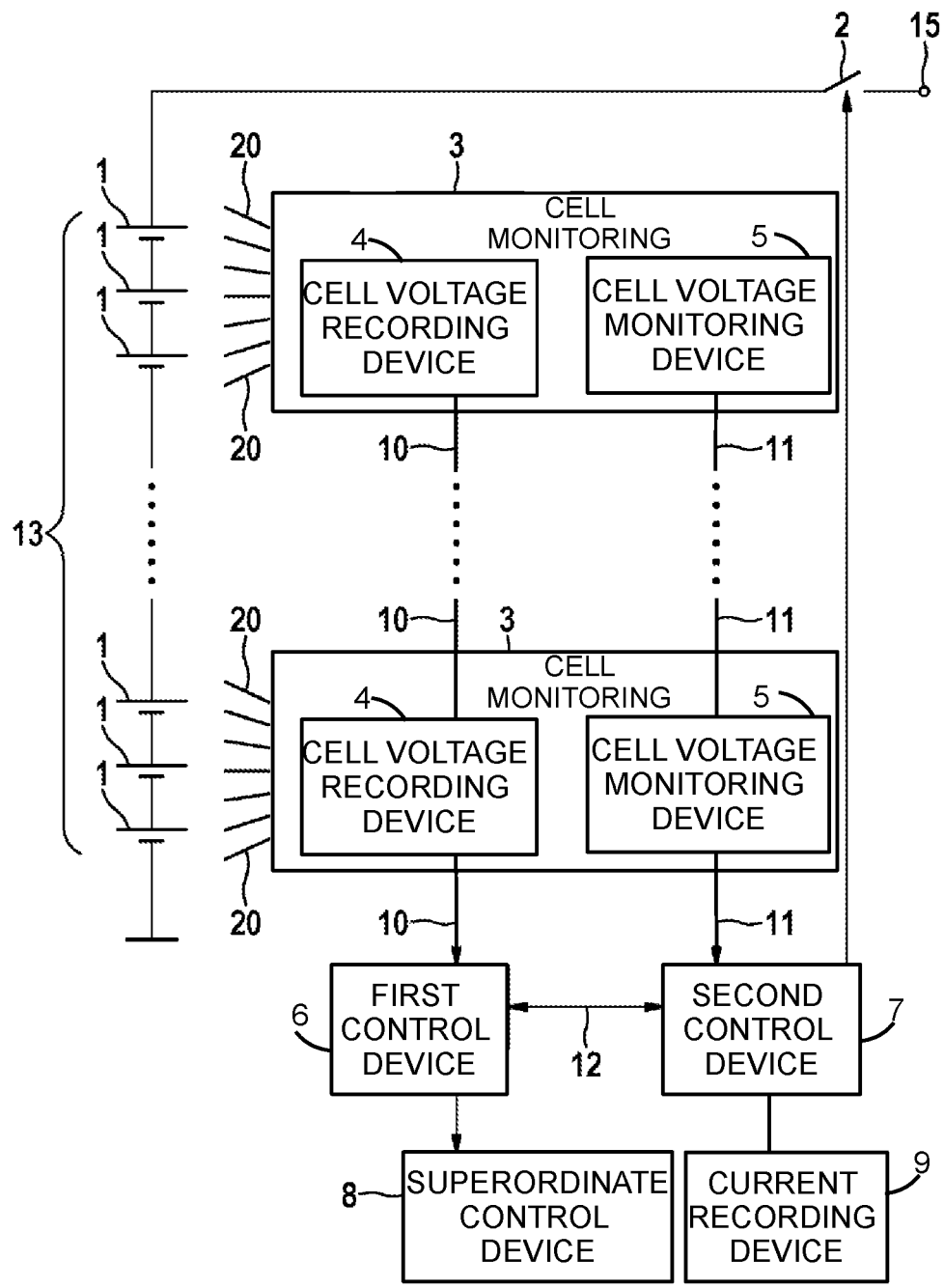

US 9,840,157 B2

BATTERY MANAGEMENT SYSTEM AND BATTERY SYSTEM

This application is a 35 U.S.C. §371 National Stage Application of PCT/EP2013/074256, filed on Nov. 20, 2013, which claims the benefit of priority to Serial No. DE 10 2012 222 721.0, filed on Dec. 11, 2012 in Germany, the disclosures of which are incorporated herein by reference in their entirety.

The disclosure relates to a regulating circuit for monitoring and regulating the operation of a rechargeable battery, in particular a lithium ion battery, having a plurality of battery cells which are connected to one another and are connected to at least one pole connection of the battery by means of at least one switching element in such a manner that they can be electrically decoupled, having at least one cell monitoring device designed to record operating parameters of at least one battery cell, and having a first control device designed to determine battery properties by evaluating operating parameters, the first control device being connected to the cell monitoring device via a first interface.

The disclosure also relates to a battery system comprising a rechargeable battery having a plurality of battery cells which are connected to one another and are connected to at least one pole connection of the battery by means of at least one switching element in such a manner that they can be electrically decoupled, and comprising a regulating circuit, in particular a battery management system, for monitoring and regulating the operation of the battery.

BACKGROUND

Regulating circuits for monitoring and regulating the operation of a rechargeable battery are known in the prior art, in particular under the name battery management system. In this case, operation of a battery is considered to be, on the one hand, a discharging operation of a battery, that is to say in particular the use of such a battery with a corresponding electrical load, and, on the other hand, a charging operation of a battery. In known regulating circuits, the cell voltages of the battery cells are recorded in this case as measured values by a plurality of so-called cell supervising circuits (CSCs) and are transmitted to a central control unit, the so-called battery control unit (BCU), via a communication bus. Currents measured by a current sensor can also be transmitted as further measured values to the battery control unit. By evaluating the measured values, the battery control unit determines battery properties such as, inter alia, the state of charge (SOC) of individual battery cells and the ageing of individual battery cells, which is also referred to as the state of health (SOH).

In addition, in such regulating circuits, the battery control unit is allocated the task of electrically disconnecting individual battery cells or a group of battery cells from the pole connections of the battery by controlling contactors if recorded measured values indicate a safety-critical state of these battery cells. Such disconnection of battery cells is very important in order to avoid major damage both to the battery and to an electrical load supplied by the battery or a charging device of the battery. This is also important, in particular, since damaged batteries such as lithium ion batteries may also result in risks for the user of such batteries, for example risk of fire and explosion.

On account of the relevance to safety, an attempt is therefore made, by means of diagnoses, to achieve the situation in which battery parameters relevant to the safety state of a battery cell, such as the cell voltages in particular, are reliably recorded and are reliably transmitted to the battery control unit via the communication bus. In this case, there is a constant need to further improve, in particular, the transmission security of the battery parameters in order to make it possible to reliably detect safety-critical states of battery cells.

The use of further diagnostic systems or further diagnostic routines results in this case in the disadvantage that the complexity of such regulating circuits is increased, in particular at the expense of the performance of such regulating circuits. The redundancy required on account of the relevance to safety when transmitting all battery parameters recorded by the cell supervising circuits to the battery control unit via the communication bus also results in the further disadvantage that the communication bus is heavily utilized. In addition, such regulating circuits have low scalability as a further disadvantage.

Against this background, an object of the present disclosure is to improve a regulating circuit for monitoring and regulating the operation of a rechargeable battery, in particular a lithium ion battery, in particular with regard to improved performance of such a regulating circuit and with regard to improved detection of safety-critical states of the battery cells.

SUMMARY

In order to achieve the object, a regulating circuit for monitoring and regulating the operation of a rechargeable battery, in particular a lithium ion battery, having a plurality of battery cells which are connected to one another and are connected to at least one pole connection of the battery by means of at least one switching element in such a manner that they can be electrically decoupled is proposed. The regulating circuit according to the disclosure has at least one cell monitoring device designed to record operating parameters of the at least one battery cell, and a first control device designed to determine battery properties by evaluating operating parameters. In this case, the first control device is connected to the cell monitoring device via a first interface. The regulating circuit according to the disclosure also has a second control device which is designed to individually control each of the switching elements and is connected to the cell monitoring device via a second interface. According to the disclosure, the battery cells may be able to be electrically decoupled individually in each case or as a group of battery cells by means of at least one switching element, a group of battery cells also being able to include, in particular, all battery cells. The regulating circuit for monitoring and regulating the operation of a rechargeable battery is preferably a battery management system.

The switching elements which are used to connect the battery cells individually in each case or in groups, for example in groups of twelve battery cells, to the pole connections and enable electrical disconnection from the pole connections as a result of being opened are preferably contactors, particularly preferably electrically controllable contactors. According to the disclosure, so-called cell supervision circuits are provided, in particular, as the cell monitoring device. According to one preferred refinement, these cell supervision circuits have an application-specific integrated circuit (ASIC) which is designed to record a cell voltage. The cell monitoring device or the cell supervision circuit advantageously also has a microcontroller which can transmit recorded operating parameters via an insulator using the first and/or the second interface. In this case, according to the disclosure, operating parameters are, in particular, cell voltages, cell temperatures, cell currents, critical cell voltages (that is to say voltages which deviate from conventional voltage values, that is to say in particular those voltages which exceed maximum limit values or undershoot minimum limit values) or measured values associated therewith. The first interface and the second interface are preferably each in the form of a communication bus, particularly preferably a CAN bus (CAN: controller area network).

According to the disclosure, battery properties determined by the first control device by evaluating received operating parameters are, in particular, the state of charge of the battery (SOC), the ageing state of the battery (SOH) and/or the functional state of the battery (SOF: state of function). The first control device is advantageously also designed to forward the ascertained or determined battery properties, preferably to a superordinate control device. When a regulating circuit according to the disclosure is used in connection with a vehicle battery used in a hybrid or electric motor vehicle, such a superordinate control device may be, for example, a superordinate vehicle control unit which is also involved in controlling the drive components, for example.

The disclosure is based on the knowledge that a regulating circuit for monitoring and regulating the operation of a rechargeable battery can be improved by virtue of the fact that two control units, rather than a single central control unit, are used, a first control unit being responsible for functions which are not relevant to the functional safety of the battery, and a second control unit being responsible for functions which are relevant to the functional safety of the battery cell. In this case, the disclosure provides for the first control unit to determine battery properties and to forward determined battery properties, in particular to a further control unit or control devices. In contrast, the second control unit controls the switching element(s) connected between the battery cells affected and the pole connections of the battery. In this case, the disclosure provides, in particular, for the second control unit to transmit an opening signal to the switching element(s) upon recording critical operating parameters, in particular critical cell voltages, whereupon the switching elements open and the corresponding battery cells are therefore electrically decoupled from the pole connections. However, the second control unit is advantageously also designed to transmit a closing signal to the switching element(s), which signal closes the switching elements.

In order for the respective functions to be used by the control units, generally referred to as control devices below, provision is advantageously made for the cell monitoring device to be designed to transmit recorded operating parameters to the first control device via a first interface and to transmit recorded operating parameters to the second control device via a second interface. Operating parameters which are transmitted from the cell monitoring device to the first control device are preferably in this case all measured cell voltage values which are recorded by the cell monitoring device at each of the relevant battery cells. Operating parameters which are transmitted to the second control device are preferably in this case only those measured values of critical cell voltages, that is to say those measured cell voltage values which can be considered to be atypical because they deviate from conventional voltage values occurring during fault-free normal operation. Such critical cell voltages are therefore, in particular, those cell voltages which exceed a cell voltage limit value defined as the maximum permissible value or undershoot a cell voltage limit value defined as the minimum permissible value.

One particularly preferred refinement of the disclosure provides for the second control device to be designed to control the at least one switching element on the basis of received operating parameters. In this case, the second control device is preferably designed to evaluate operating parameters and to control the switching elements on the basis of the result of the evaluation of received operating parameters. In this case, operating parameters received by the second control device are, in particular, cell voltages according to the disclosure. According to one refinement variant, all cell voltages or measured cell voltage values recorded by the cell monitoring device can be transmitted to the second control device, the second control device evaluating the received cell voltages in order to determine whether critical cell voltages have occurred at one or more battery cells. According to another advantageous refinement variant of the disclosure, only critical measured cell voltage values are transmitted to the second control device, the second control device being designed, upon receiving these critical cell voltages, to electrically disconnect the relevant battery cells from the at least one pole connection of the battery by controlling the at least one switching element. It is also proposed that the second control device is designed to control the at least one switching element on the basis of recorded currents, in particular charging currents. This advantageously makes it possible for the battery cells to be able to be electrically disconnected from the pole connections of the battery when impermissible charging currents occur, with the result that damage to the battery cells, for example caused by excessively high charging currents, can be avoided.

According to another advantageous refinement of the disclosure, the cell monitoring device has at least one cell voltage recording device which is designed to record the cell voltage of the at least one battery cell as a measured voltage value. In this case, provision is made, in particular, for the cell voltage recording device to be in the form of an application-specific integrated circuit (ASIC) for recording cell voltages. According to another advantageous refinement of the invention disclosure, the cell voltage recording device or else the cell monitoring device is designed to transmit recorded measured voltage values to the first control device via the first interface, preferably using a microcontroller.

Another advantageous aspect of the disclosure provides for the cell monitoring device to comprise a cell voltage monitoring device which is designed to record exceeding of a maximum cell voltage limit value and/or undershooting of a minimum cell voltage limit value. The cell voltage monitoring device is preferably generally designed to record a cell voltage value that deviates from an expected value and to separate critical cell voltages from non-critical cell voltages on the basis of the deviation difference. The cell voltage monitoring device advantageously has a comparator circuit for the purpose of determining such extreme voltage values.

The cell voltage monitoring device is advantageously also designed to transmit a recorded deviation from a voltage limit value to the second control device via the second interface and/or to signal said deviation to the second control device. The cell voltage monitoring device is preferably designed, upon recording an extreme voltage value, to transmit an alarm signal to the second control device as an operating parameter and to signal a deviation from a voltage limit value to the second control device in this manner. The reception of such an alarm signal advantageously causes the second control device to electrically decouple the at least one battery cell by appropriately controlling the at least one switching element.

According to another advantageous aspect of the disclosure, the second control device is connected to a current recording device, the current recording device advantageously being designed to record a charging current and/or a discharging current of the battery as a measured current value and to transmit recorded measured current values to the second control device. The second control device is advantageously also designed to control the at least one switching element on the basis of received measured current values. In particular, the second control device is designed to control individual switching elements or all switching elements, upon receiving abnormal measured current values which indicate an operational disruption, in such a manner that the switching elements open and the battery cells are electrically disconnected from the pole connections of the battery, with the result that the flow of current is interrupted.

Another advantageous refinement of the disclosure provides for the first control device and the second control device to be connected to one another via a third interface, the first control device being designed to transmit data to the second control device via the third interface, and the second control device being designed to transmit data to the first control device via the third interface. In this case, the disclosure provides for the second control device to be designed to transmit recorded measured current values to the first control device, the first control device advantageously being designed to incorporate the received measured current values as operating parameters in the evaluation of operating parameters according to the disclosure and to allow the received measured current values to be included in the determination of battery properties. The first control device is advantageously also designed to transmit received measured cell voltage values which exceed a maximum limit value or undershoot a minimum limit value to the second control device. This advantageously produces additional redundancy, as a result of which it is possible to control the at least one switching element by means of the second control device in an even more reliable manner, in particular since the second control device can evaluate whether or not there is a safety-critical state in an even more reliable manner. For such evaluation, the second control device advantageously compares values received from the cell voltage monitoring device with values received from the first control device. In this case, the second control device advantageously uses the values received from the first control device to check the plausibility of the values received from the cell voltage monitoring device.

The present disclosure also proposes a battery system comprising a rechargeable battery having a plurality of battery cells which are connected to one another and are connected to at least one pole connection of the battery by means of at least one switching element in such a manner that they can be electrically decoupled, and comprising a regulating circuit, in particular a battery management system, for monitoring and regulating the battery, the regulating circuit being a regulating circuit according to the disclosure. In particular, provision is made for the battery system to be a battery system designed for use in electric and/or hybrid motor vehicles.

BRIEF DESCRIPTION OF THE DRAWING

Further advantageous details, features and refinement details of the disclosure are explained in more detail in connection with the exemplary embodiment illustrated in the FIGURE, in which:

the FIGURE shows a schematic illustration of an exemplary embodiment of a battery system according to the disclosure.

DETAILED DESCRIPTION

In the battery system illustrated in the FIGURE, a plurality of battery cells 1 have been interconnected to form a rechargeable battery. In this case, the battery cells 1 can be electrically decoupled as a group 13 from the pole connection 15 of the battery and therefore from an electrical load or from a charging apparatus for charging the battery via the switching element 2 in the form of a contactor. One refinement variant of the disclosure (not illustrated) provides for individual battery cells or smaller groups of battery cells to also be able to be disconnected from the battery via corresponding switching elements, a corresponding switching element preferably being arranged between the individual battery cells and a corresponding parallel circuit provided with a switching element respectively being provided for bridging the battery cell.

The battery system illustrated in the FIGURE has a regulating circuit for monitoring and regulating the operation of the rechargeable battery. In the present case, the regulating circuit has a first control device 6, a second control device 7, a plurality of cell monitoring devices 3 (only two cell monitoring devices 3 are illustrated in the FIGURE for better clarity) and a current recording device 9. In this case, the cell monitoring devices 3 are connected to the first control device 6 via a CAN bus as a first communication interface 10. In addition, the cell monitoring devices 3 are connected to the second control device 7 via a second CAN bus 11. The cell monitoring devices 3 are each designed to record operating parameters of a respective group of battery cells 1 and to transmit recorded operating parameters to the first control device 6 via the CAN bus 10 and to transmit recorded operating parameters to the second control device 7 via the CAN bus 11. The cell voltage monitoring devices 3 each comprise a cell voltage recording device 4 which is designed to record the cell voltage of the individual battery cells 1 in a group of battery cells 1 as a measured voltage value. For this purpose, the cell voltage recording devices 4 have an accordingly designed application-specific integrated circuit (ASIC) which is not explicitly illustrated in the FIGURE. The measured cell voltage values recorded by the cell voltage recording devices 4 are transmitted to the first control device 6 via microcontrollers (likewise not explicitly illustrated in the FIGURE) of the cell voltage recording devices 4 using the CAN bus 10.

The cell monitoring devices 3 each also have a cell voltage monitoring device 5 which is designed to record exceeding of a maximum cell voltage limit value and/or undershooting of a minimum cell voltage limit value. In this case, the cell voltage monitoring devices 5 are advantageously each in the form of a comparator and compare recorded measured cell voltage values with predefined maximum and minimum cell voltage values. If a cell voltage monitoring device 5 determines that a maximum measured cell voltage value has been exceeded or a minimum measured cell voltage value has been undershot, the cell voltage monitoring device 5 transmits an alarm signal to the second control device 7.

The first control device 6 of the regulating circuit illustrated in the FIGURE is designed to receive and evaluate measured cell voltage values via the data bus 10. In addition, the first control device 6 is designed to receive measured current values from the second control device 7 via the further data bus 12. These measured current values are recorded by the current recording device 9 and are transmitted to the second control device 7 which forwards the measured current values to the first control device 6. The first control device 6 evaluates the received measured cell voltage values and the received measured current values as operating parameters of the battery and, on the basis of the evaluation, determines battery properties such as, in particular, the state of charge of the battery, the ageing of the battery and the functional state of the battery. The battery properties determined can be transmitted from the first control device 6 to a superordinate control device 8, a superordinate vehicle control system in the present case. If the control device 6 determines a critical functional state from the recorded operating parameters, for example because received measured cell voltage values exceed a maximum limit value, the control device 6 transmits an alarm signal to the second control device 7.

The second control device 7 is designed to receive operating parameters from the cell monitoring device 3 or the cell monitoring device 5 via the data bus 11 and to receive data from the first control device 6 via the further data bus 12. On the basis of received operating parameters, the second control device 7 can control the contactor 2 in order to thus interrupt the electrical connection between the battery cells 1 and the pole connection 15 of the battery. As an operating parameter, the second control device 7 receives an alarm signal in this case from the cell voltage monitoring devices 5 if a maximum permissible cell voltage is exceeded or if a minimum permissible cell voltage is undershot. In this case, an alarm signal received from the first control device 6 is used to check the plausibility of the alarm signal transmitted by the cell voltage monitoring devices 5. According to a conservative design of the regulating circuit according to the disclosure, provision may also be made, in particular, for the second control device 7 to control the contactor 2 to interrupt the electrical connection if either one of the cell voltage monitoring devices 5 or the first control device 6 transmits an alarm signal to the second control device.

The exemplary embodiment illustrated in the FIGURE and explained in connection with the latter is used to explain the disclosure and does not restrict the latter.

The invention claimed is:

1. A regulating circuit for monitoring and regulating the operation of a rechargeable battery having a plurality of interconnected battery cells and at least one pole connection connected to the battery cells by at least one switching element, such that the battery cells are electrically decoupleable from the at least one pole connection, the regulating circuit comprising:
a first cell monitoring device configured to record operating parameters of a first portion of the plurality of interconnected battery cells;
a second cell monitoring device configured to record operating parameters of a second portion of the plurality of interconnected battery cells;
a first control device connected to the first cell monitoring device and the second cell monitoring device via a first data bus, the first control device being configured to determine battery properties based on first operating parameters received from the first cell monitoring device and the second cell monitoring device via the first data bus;
a second control device connected to the first cell monitoring device and the second cell monitoring device via a second data bus, the second data bus being separate from the first data bus, the second control device being configured to:
receive second operating parameters from the first cell monitoring device and the second cell monitoring device via the second data bus; and
control the at least one switching element in response to identifying a fault in at least one battery cell in the plurality of interconnected battery cells based on the second operating parameters.

2. The regulating circuit as claimed in claim 1, at least one of the first cell monitoring device and the second cell monitoring device further comprising:
a cell voltage recording device configured to record a cell voltage of at least one battery cell as a measured voltage value.

3. The regulating circuit as claimed in claim 2, wherein the cell voltage recording device is configured to transmit recorded measured voltage values to the first control device via the first data bus.

4. The regulating circuit as claimed in claim 2, the cell voltage recording device being further configured to:
record the critical cell voltage parameters corresponding to exceeding of a maximum cell voltage limit value and/or undershooting of a minimum cell voltage limit value.

5. The regulating circuit as claimed in claim 4, wherein the cell voltage monitoring device is configured to transmit the critical cell voltage parameters to the second control device via the second data bus.

6. The regulating circuit as claimed in claim 1, wherein:
the second control device is connected to a current recording device;
the current recording device is configured to record a charging current and/or a discharging current of the rechargeable battery as a measured current value and to transmit recorded measured current values to the second control device; and
the second control device is configured to operate the at least one switching element in response to identifying a fault in at least one battery cell in the plurality of interconnected battery cells based on the recorded measurement current values.

7. The regulating circuit as claimed in claim 1, further comprising:
a third data bus configured to connect the first control device to the second control device,
wherein the first control device is configured to transmit data to the second control device via the third data bus, and
wherein the second control device is configured to transmit data to the first control device via the third data bus.

8. The regulating circuit of claim 1, the second control device being directly connected to the first cell monitoring device and the second cell monitoring device via the second data bus, the second control device being further configured to:
receive second operating parameters from the first cell monitoring device and the second cell monitoring device via the second data bus, the second operating parameters corresponding only to critical cell voltage parameters in the plurality of interconnected battery cells; and
control the at least one switching element in response to identifying a fault in at least one battery cell in the plurality of interconnected battery cells based on the second operating parameters.

9. A battery system comprising:
a rechargeable battery having a plurality of interconnected battery cells and at least one pole connection connected to the plurality of interconnected battery cells by at least one switching element, such that the battery cells are electrically decoupleable from the at least one pole connection; and
a regulating circuit configured to monitor and regulate operation of the rechargeable battery, the regulating circuit comprising:
  a first cell monitoring device configured to record operating parameters of a first portion of the plurality of interconnected battery cells;
  a second cell monitoring device configured to record operating parameters of a second portion of the plurality of interconnected battery cells;
  a first control device connected to the first cell monitoring device and the second cell monitoring device via a first data bus, the first control device being configured to determine battery properties based on first operating parameters received from the first cell monitoring device and the second cell monitoring device via the first data bus;
  a second control device connected to the first cell monitoring device and the second cell monitoring device via a second data bus, the second data bus being separate from the first data bus, the second control device being configured to:
    receive second operating parameters from the first cell monitoring device and the second cell monitoring device via the second data bus; and
    control the at least one switching element in response to identifying a fault in at least one battery cell in the plurality of interconnected battery cells based on the second operating parameters.

10. The battery system of claim 9, the second control device being directly connected to the first cell monitoring device and the second cell monitoring device via the second data bus, the second control device being further configured to:
receive second operating parameters from the first cell monitoring device and the second cell monitoring device via the second data bus, the second operating parameters corresponding only to critical cell voltage parameters in the plurality of interconnected battery cells; and
control the at least one switching element in response to identifying a fault in at least one battery cell in the plurality of interconnected battery cells based on the second operating parameters.

* * * * *